United States Patent
Swamy et al.

(10) Patent No.: US 8,547,143 B2
(45) Date of Patent: Oct. 1, 2013

(54) RESONANT GATE DRIVE CIRCUIT FOR A POWER SWITCHING DEVICE IN A HIGH FREQUENCY POWER CONVERTER

(75) Inventors: Mahesh M. Swamy, Gurnee, IL (US); Tsuneo Joe Kume, Katikyushu (JP)

(73) Assignee: Yaskawa America, Inc., Waukegan, IL (US)

( * ) Notice: Subject to any disclaimer, the term of this patent is extended or adjusted under 35 U.S.C. 154(b) by 182 days.

(21) Appl. No.: 13/211,481

(22) Filed: Aug. 17, 2011

(65) Prior Publication Data

US 2012/0176176 A1    Jul. 12, 2012

Related U.S. Application Data

(60) Provisional application No. 61/431,216, filed on Jan. 10, 2011.

(51) Int. Cl.
*H03B 1/00* (2006.01)

(52) U.S. Cl.
USPC ........... 327/109; 327/110; 327/404; 327/399; 327/434

(58) Field of Classification Search
USPC .................................. 327/109, 404, 399, 434
See application file for complete search history.

(56) References Cited

U.S. PATENT DOCUMENTS

| | | | |
|---|---|---|---|
| 4,967,109 A | 10/1990 | Steigerwald | |
| 5,010,261 A | 4/1991 | Steigerwald | |
| 5,134,320 A | 7/1992 | Perusse | |
| 5,264,736 A | 11/1993 | Jacobson | |
| 5,804,943 A | 9/1998 | Kollman et al. | |
| 5,969,966 A * | 10/1999 | Sawa et al. | 363/163 |
| 6,084,458 A * | 7/2000 | Fu | 327/330 |
| 6,208,195 B1 * | 3/2001 | Wyland | 327/434 |
| 7,365,579 B2 * | 4/2008 | Kimura et al. | 327/109 |
| 2012/0176176 A1 * | 7/2012 | Swamy et al. | 327/399 |

FOREIGN PATENT DOCUMENTS

JP    3-60360    3/1991

OTHER PUBLICATIONS

Ian D. de Vries, "A Resonot Power MOSFET/IGBT Gate Driver," APEC 2002, vol. 1, pp. 179-185, 2002.

* cited by examiner

*Primary Examiner* — Ryan Jager
(74) *Attorney, Agent, or Firm* — Wood, Phillips, Katz, Clark & Mortimer

(57) ABSTRACT

A resonant gate drive circuit for a power switching device, having a gate-emitter capacitance, is adapted for use with a high frequency power converter. The resonant gate drive circuit comprises a signal input source, a power supply and a resonant inductor. An electrical isolator is connected between the signal input source and a switching node. The electrical isolator is connected to the power supply. A first bidirectional switch is connected between the resonant inductor and the power switching device and includes a first switch control circuit connected to the node to be controlled by a signal from the signal input source. A second bidirectional switch is connected between the power supply and the power switching device and includes a second switch control circuit connected to the node to be controlled by the signal from the input source. The first and second control circuits are adapted to control the first bidirectional switch to provide a first charge path during a resonant period from the resonant inductor to the gate-emitter capacitance defining a quick resonant charge path and to control the second bidirectional switch to provide a second charge path defining a voltage equalization charge path subsequent to the resonant period.

20 Claims, 4 Drawing Sheets

RESONANT GATE DRIVE CIRCUIT FOR A POWER SWITCHING DEVICE IN A HIGH FREQUENCY POWER CONVERTER

CROSS-REFERENCE TO RELATED APPLICATIONS

This application claims priority of provisional Application No. 61/431,216, filed Jan. 10, 2011.

FEDERALLY SPONSORED RESEARCH OR DEVELOPMENT

Not Applicable.

MICROFICHE/COPYRIGHT REFERENCE

Not Applicable.

FIELD OF THE INVENTION

This application relates to a gate drive circuit for a power switching device and, more particularly, to an efficient resonant gate drive circuit for high frequency applications.

BACKGROUND OF THE INVENTION

It is well known that in order to turn on and off high power switching devices, such as IGBT/MOSFETs, employed in various power electronic converters the on-off control signals need to be electrically isolated from the main power switch. The electrical isolation is typically accomplished by means of photo-couplers. The resulting isolated control signal is amplified using an isolated power supply before being applied across the Gate and Emitter junction of the IGBT/MOSFET. Lately, to reduce component count and cost, the photo-couplers take on the task of electrically isolating as well as amplifying the signal, which is then applied directly across the Gate and Emitter junction of IGBT/MOSFETs.

The above mentioned method, which is currently used by a majority of power semiconductor users, is not well suited for high frequency applications in the hundreds of kilo hertz (kHz) range. Many Variable Frequency Drive (VFD) manufacturers are working on bringing out power semiconductor switches employing Silicon Carbide and/or Gallium Nitride devices that have low switching losses and hence can be turned ON and OFF at hundreds of kHz. Higher switching speed using devices that are known to have reduced power loss will enable to operate motors at higher speeds and reduce the VFD foot print per kW of delivered output power. External filtering component sizes can also be dramatically reduced. In response to such positive research activity, it is important to consider efficient means of turning ON and OFF the future power semiconductor switches that will be employing GaN devices.

Since existing IGBT/MOSFET switches as well as the future switches will be voltage controlled devices, the Gate to Emitter junction will have a metal-oxide layer, which will be associated with an input capacitance. Turning ON and OFF these devices entails charging and discharging the junction capacitance. When the rate at which the junction is turned ON and OFF is increased, the current consumed by the gate circuit will naturally increase. Higher current entails a larger gate drive power supply and possibly more gate drive power loss.

At higher operating speed, the delay introduced by the intrinsic capacitance of the photo-coupler will be noticeable and can create unfavorable control response.

Many researchers have proposed resonant gate drive circuits to reduce power consumption in gate drive circuits and to improve the speed at which Si based semiconductor switches can be turned ON and OFF.

One of the earliest researchers on this topic, Dr. Robert Steigerwald, has published many articles on this subject, and has at least two patents that are relevant here. In U.S. Pat. No. 4,967,109, a resonating inductor is used in series with a switch in the gate-emitter circuit. The inductor resonates with the gate-emitter capacitor thereby charging the capacitor to a value close to twice the gate drive power supply voltage. During the first half of the charging cycle, energy is stored in the inductor, which is then released into the gate-emitter capacitor in the latter half, thereby boosting the capacitor voltage as mentioned. A diode in series with the switch is used to prevent the reversal of the resonant current after it goes through its natural zero. Since the switch and the blocking diode carry the resonant charging current, the power loss in these devices cannot be neglected. Moreover, the voltage across the inductor needs to be reset, using some external means, which is not shown in the patent, so that the inductor is ready for the next turn ON pulse. Due to the presence of the switch and diode in series with the inductor, such a circuit is not well suited for high frequency operation.

At turn off, in the above circuit, the gate-emitter capacitor is simply discharged into the source via a switch. Instead of wasting this energy, the same author, in U.S. Pat. No. 5,010,261, used an external capacitor to transfer the gate energy on to this external capacitor. The transfer is facilitated by an external inductor and a bidirectional switch. Theoretically, the arrangement in U.S. Pat. No. 5,010,261 should result in a very low loss gating scheme. However, due to the presence of the bidirectional switch in addition to the main gate drive switch, the overall loss is not significantly reduced. In addition, the component count has increased, which makes the circuit in U.S. Pat. No. 5,010,261 unattractive.

A more complex scheme utilizing a high frequency transformer in place of an inductor is used for storing the discharge energy of the capacitor in the circuit proposed in U.S. Pat. No. 5,134,320. Because of the added external circuit components and the power loss associated with such external devices, the circuit proposed in U.S. Pat. No. 5,134,320 does not meet the requirements for the suggested application.

A resonant gate drive circuit utilizing coupled inductors and external diodes to return part of the stored gate energy back to the gate drive power supply forms the core of the circuit proposed in U.S. Pat. No. 5,264,736. Again, the fact that charging current is made to flow through driver transistors and external diodes make this circuit bulky, less efficient, and more expensive.

A circuit quite similar to the one in U.S. Pat. No. 4,967,109 has been proposed in U.S. Pat. No. 5,804,943 and suffers from similar disadvantages.

When an inductor is used as part of a gate drive scheme to charge up the gate-emitter capacitance of an IGBT/MOSFET, as in all the circuits discussed thus far, there is a cross conduction problem that entails power loss, when the upper driver transistor is turned OFF and the lower transistor is turned ON to discharge the capacitor. In order to avoid such occurrence, either a cross current regulating inductor of the type mentioned in U.S. Pat. No. 5,264,736 can be used or one could use two separate inductors as mentioned by Ian D. de Vries, in "A Resonant Power MOSFET/IGBT Gate Driver", IEEE Applied Power Electronics Conference and Exposition (APEC) 2002, Vol. 1, pp 179-185. The circuit discussed therein has been operated at a carrier frequency of 1 MHz where the resonating inductor is formed by simply using a wire of length 6 cms. However, in all circuits that force the complete charging current through the inductor and a switch are always going to have non trivial power loss associated with them.

One known circuit advocates parallel paths for charging the gate-emitter capacitance. A resonant inductor path provides the initial charging current to quickly charge the gate-emitter capacitance. The remaining current needed to bring the gate-emitter voltage of the IGBT/MOSFET to the Vcc level of the supply voltage is provided by an alternate low loss path. This basic idea forms the core of the Japanese patent 3-60360.

The circuit documented in Japan patent 3-60360 is shown in FIG. 1. The basic operation involves charging the gate-emitter capacitance C by an initial surge of current provided by the energy exchange between the resonating inductor L and the gate-emitter capacitance. After the gate-emitter capacitance C gets charged to a certain turn-on level, the complete turn ON is achieved by augmenting the gate current from the standard gate power supply. This forms a two stage charging strategy that reduces the current rating of the photo coupler and improves the propagation delay. The energy stored in the gate-emitter capacitance is basically circulated between the resonating inductor and the capacitance. During this circulation there is some amount of loss, which needs to be replenished from the gate power supply. The overall strategy results in optimal performance and reduces the gate power requirements.

Referring to FIG. 1, it is assumed that the voltage across the gate-emitter capacitance C is at −Vcc to begin. When it is desired to turn on the IGBT/MOSFET Q5, a turn ON signal is provided to a switch $11_1$ (the switch in series with the resonating inductor L, the entire combination of which is in shunt, across the gate-emitter of the main IGBT/MOSFET Q5). A resonating current pulse enables the transfer of energy stored in the gate-emitter capacitance C to the resonating inductor L. In the process, the gate-emitter capacitor C charges from −Vcc to a certain positive value which is close to +Vcc but not exactly at +Vcc due to losses in the circuit. The voltage across the gate-emitter is brought up to +Vcc by turning ON switch $6_1D$, which connects the gate terminal to +Vcc of the gate power supply via the charging resistor R. The second charging stage ensures that the main IGBT/MOSFET operates in the saturation state.

When it is desired to turn OFF the main IGBT/MOSFET Q5, a turn off signal is given to a switch $11_2$ and a resonating current pulse flows through the gate-emitter capacitance C and inductor L in the opposite direction and removes the charge from the gate thereby enabling safe turn off. The gate-emitter capacitance C reverses in polarity and a second discharge state to −Vcc is provided by turning ON a switch $6_2D$ after a brief moment.

The key to proper operation of the circuit in FIG. 1 is that the switches $6_1D$ and $6_2D$ connecting the gate to +Vcc and −Vcc, respectively are delayed compared to the switches $11_1$ and $11_2$ that allow transfer of energy between the resonating inductor L and the gate-emitter capacitance C. A circuit that achieves this requirement is shown in FIG. 2 and is part of the Japan patent 3-60360. The buffer amplifier shown in FIG. 2 is generic and any commercially available part can be used as the buffer amplifier.

The delay in turning ON of switches $6_1D$ and $6_2D$ is provided by the RC circuit in the base drive of these transistors formed by a resistor 18 and a capacitor 17. In order to reduce the power loss in transistors $11_1$ and $11_2$, these are turned ON for only a short duration of time, enough to facilitate the transfer of energy between the resonating inductor L and the gate-emitter capacitance C of the main IGBT/MOSFET Q5. Hence, the base drive for transistors $11_1$ and $11_2$ have an R-C differential circuit formed by a resistor 14 and a capacitor 12.

The circuit implementation shown in FIG. 2 does not show that the main pulse used for turning ON and OFF the power IGBT/MOSFET Q5 is in fact isolated (either optically or magnetically) from the control circuit that generates the pulse. It is assumed that one knowledgeable in this area understands the need to isolate the control logic from the gate drive circuit. However, the circuit in FIG. 2 can be modified to provide an easier implementation using a traditional photo coupler.

The present invention is directed to further improvements in resonant gate drive circuits. Particularly, in order to reduce the ON and OFF delay, as well as reduce the overall propagation delay, improvements to the circuit shown in Japanese patent 3-60360 are disclosed herein.

SUMMARY OF THE INVENTION

In accordance with the invention, an efficient resonant gate drive scheme is provided for high frequency applications.

Broadly, in accordance with one aspect of the invention, there is disclosed a resonant gate drive circuit for a power switching device, having an input capacitance, for a high frequency power converter. The resonant gate drive circuit comprises a signal input source, a power supply and a resonant inductor. An electrical isolator is connected between the signal input source and a switching node. The electrical isolator is connected to the power supply. A first bidirectional switch is connected between the resonant inductor and the power switching device and includes a first switch control circuit connected to the node to be controlled by a signal from the signal input source. A second bidirectional switch is connected between the power supply and the power switching device and includes a second switch control circuit connected to the node to be controlled by the signal from the input source. The first and second control circuits are adapted to control the first bidirectional switch to provide a first charge path during a resonant period from the resonant inductor to the input capacitance defining a quick resonant charge path and to control the second bidirectional switch to provide a second charge path defining a voltage equalization charge path subsequent to the resonant period.

It is a feature of the invention that the second bidirectional switch is connected between the node and the power switching device wherein the control signal is amplified by transistors in the electrical isolator.

It is an additional feature of the invention that the second bidirectional switch is connected directly to the power supply.

It is another feature of the invention that the first control circuit comprises a differential circuit that converts a signal change at the node to a transitory pulse.

It is a further feature of the invention that the second control circuit comprises a delay circuit.

It is an additional feature of the invention that a resistor is connected between the power supply and the second bidirectional switch wherein the voltage equalization charge path comprises a slower discharging stage of the gate-emitter capacitance.

It is yet another feature of the invention that initial energy stored in the gate-emitter capacitance is provided from the power supply and thereafter, the power supply subsequently provides energy lost during transfer of energy between the resonant inductor and the input capacitance during the resonant period.

It is still a further feature of the invention that the electrical isolator comprises a photo coupler.

It is yet an additional feature of the invention that the second bidirectional switch includes first and second transistors each connected in series with a diode and a resistor to opposite polarities of the power supply.

There is disclosed in accordance with another aspect of the invention, a resonant gate drive circuit for a power switching device, having a gate-emitter capacitance, for a high frequency power converter. The resonant gate drive circuit comprises a signal input source, a power supply and a resonant inductor. An electrical isolator is connected between the signal input source and a switching node. The electrical isolator is connected to the power supply. A first bidirectional switch is connected between the resonant inductor and the power switching device and includes a first switch control circuit connected to the node to be controlled by a signal from the signal input source. A second bidirectional switch is connected between the power supply and the power switching device and includes a second switch control circuit connected to the node to be controlled by the signal from the input source. The first and second control circuits are adapted to control the first bidirectional switch to provide a first charge path during a resonant period from the resonant inductor to the capacitance and to control the second bidirectional switch to provide a second charge path defining a voltage equalization charge path subsequent to the resonant period wherein initial energy stored in the gate-emitter capacitance is provided from the power supply and thereafter, the power supply subsequently provides energy lost during transfer of energy between the resonant inductor and the gate-emitter capacitance during the resonant period.

The proposed new gate drive scheme hence addresses the following issues: The new gate drive technique will consume less power than a traditional scheme when operated at switching frequency in the hundreds of kHz range, and the new gate drive scheme will faithfully follow the input control signal without introducing any significant delay so as not to degrade the control response.

By reducing the power consumption in the gate drive circuit, the size of the switch mode power supply (SMPS) transformer can be reduced thereby improving the overall drive efficiency and reducing the size of the board that houses the SMPS transformer. Overall cost reduction can also be achieved.

Other objects, features, and advantages of the invention will become apparent from a review of the entire specification, including the appended claims and drawings.

DETAILED DESCRIPTION OF THE PREFERRED EMBODIMENT

Figure 1:
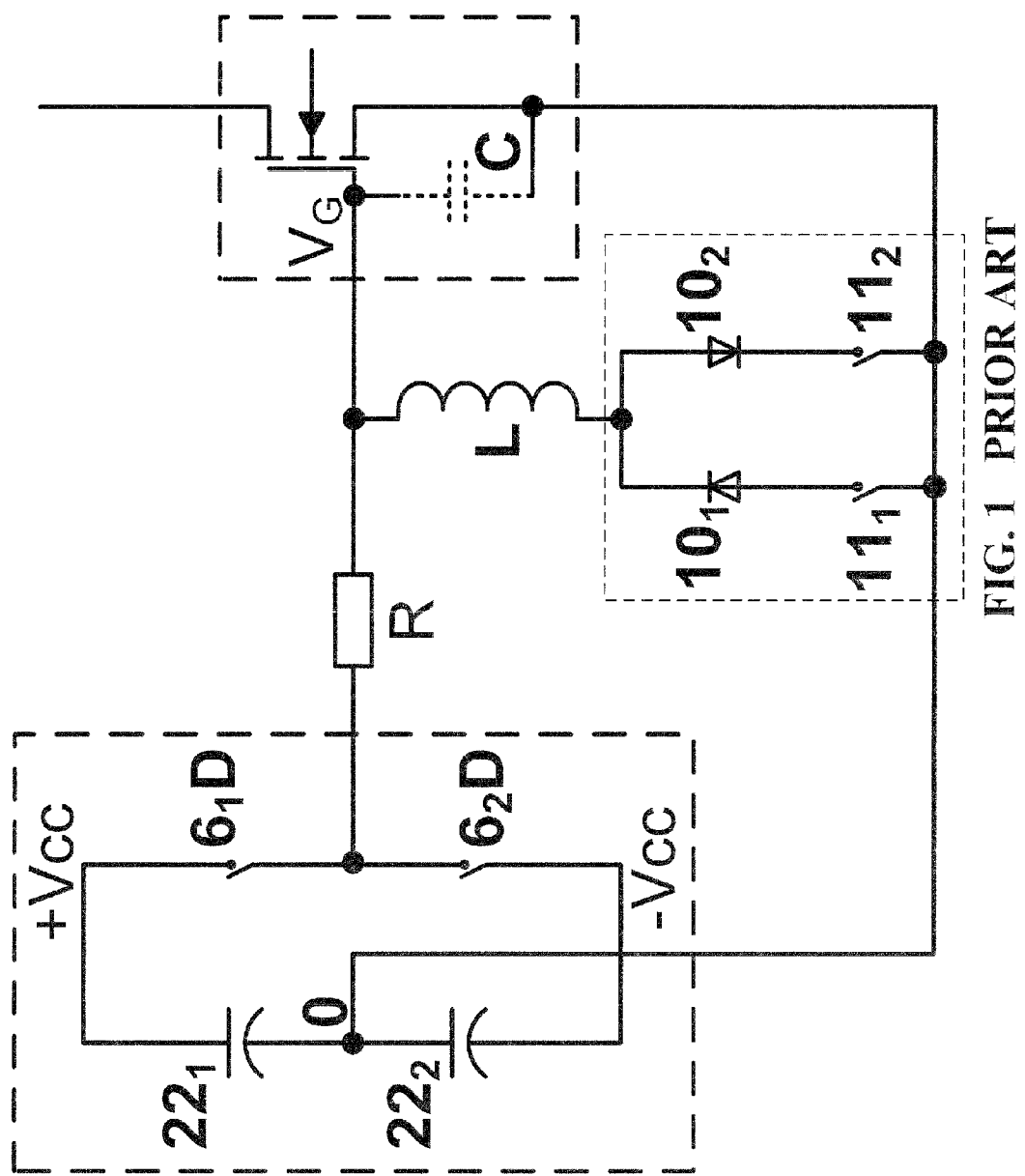
FIG. 1 is an electrical schematic of a prior art gate drive circuit.
Figure 2:
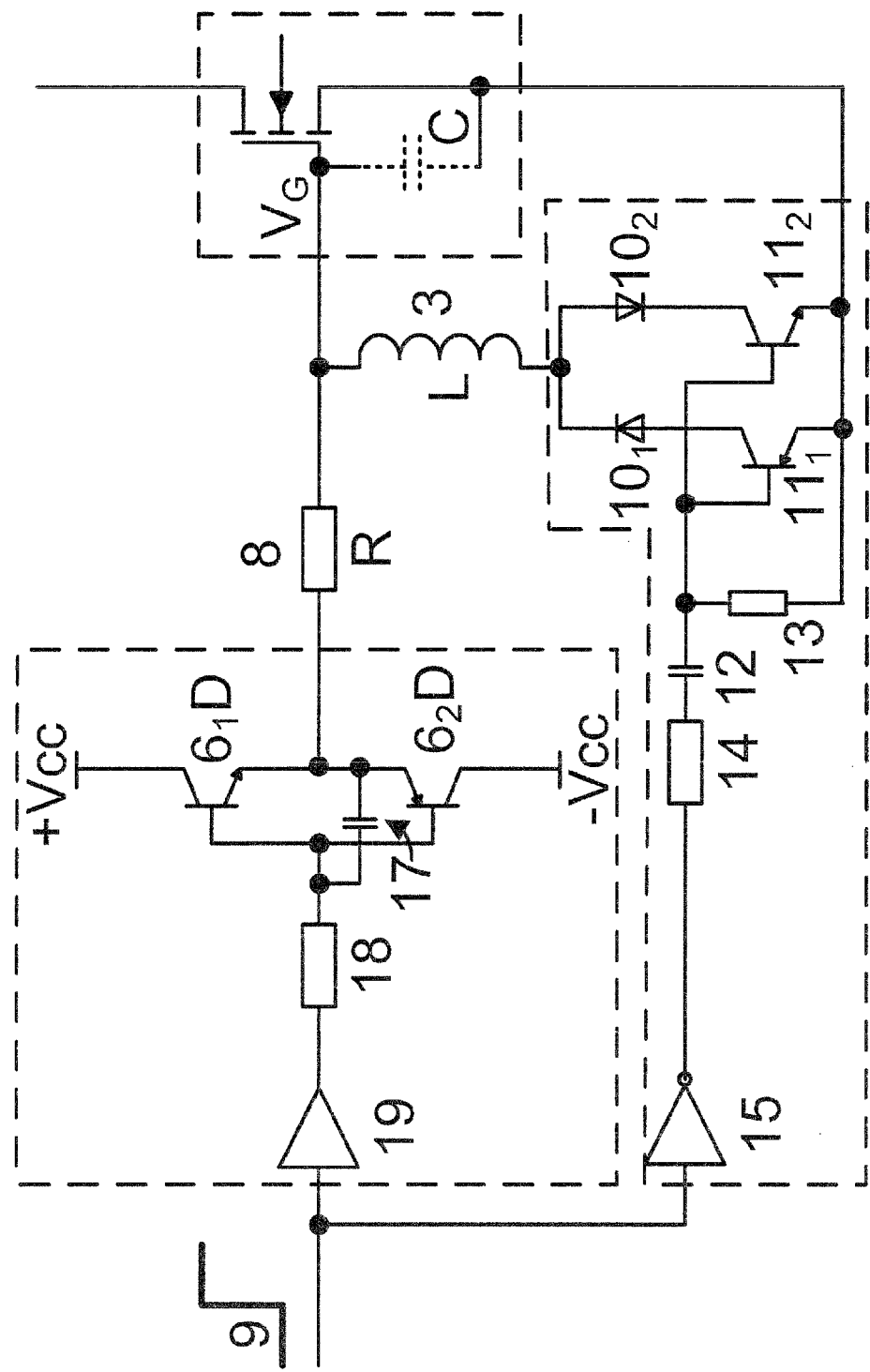
FIG. 2 is an electrical schematic of a prior art gate drive circuit.
Figure 3:
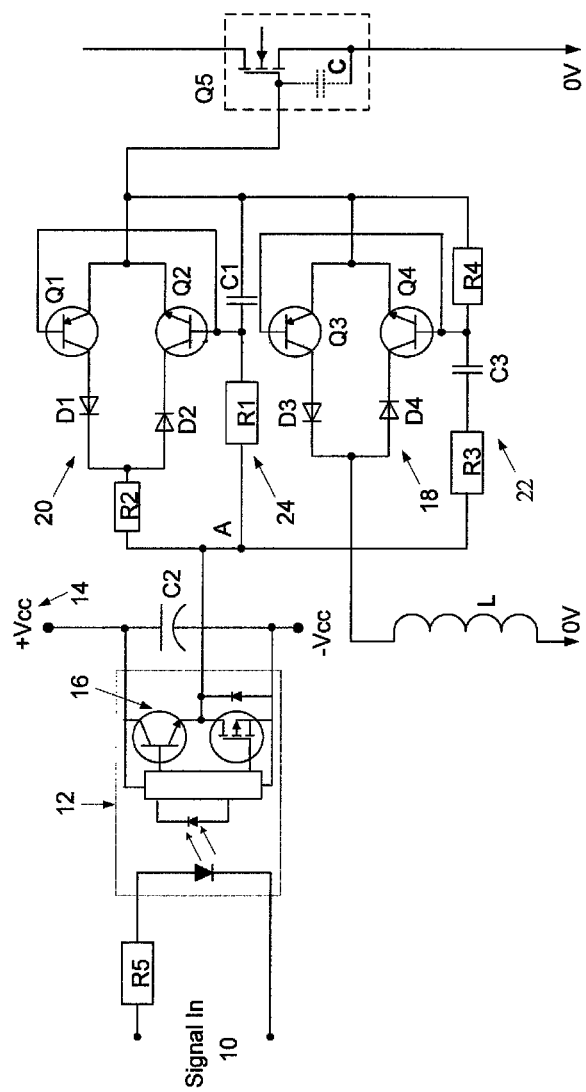
FIG. 3 is a resonant gate drive circuit according to a first embodiment of the invention.

FIG. 3 illustrates an electrical schematic in accordance with a first embodiment of the invention for an efficient resonant gate drive circuit for high frequency applications. Particularly, the gate drive circuit is for a power switching device Q5 having a gate-emitter capacitance C. The power switching device Q5 is adapted to be used in a high frequency power converter in a variable frequency drive (VFD), as discussed above. Particularly, the VFD operates in the hundreds of kHz range. The power switching device Q5 may comprise an IGBT/MOSFET switch, or other type of high power switching device, as will be apparent.

The gate drive circuit includes a signal input source 10. The signal input source 10 typically comprises a switching command from a control for the VFD. The signal input source 10 is connected via a resistor R5 to an electrical isolator 12. In the illustrated embodiment of the invention, the electrical isolator comprises a photo-coupler. The output of the photo-coupler 12 is identified as a node A. The photo-coupler 12 is connected to a DC power supply 14 defined by a positive polarity node +Vcc and an opposite negative polarity node −Vcc. A capacitor C2 is connected between the nodes +Vcc and −Vcc. The voltage from the power supply 14 is connected to an amplifier transistor stage 16 of the photo coupler 12. Thus, an isolated command signal from the signal input source 10 is amplified and supplied to the node A.

The gate drive circuit includes a first bidirectional switch 18 and a second bidirectional switch 20. The second bidirectional switch 20 includes a PNP transistor Q1 and an NPN transistor Q2 having their emitters and bases connected to one another. The collector of the transistor Q1 is connected to a diode D1. The collector of the transistor Q2 is connected to an opposite polarity diode D2. Opposite sides of the diodes D1 and D2 are connected via a resistor R2 to the node A. The emitters are connected to the gate of the power switch Q5.

The first bidirectional switch 18 includes a PNP transistor Q3 and an NPN transistor Q4. The emitters of the transistors Q3 and Q4 are connected together and to the emitters of the transistors Q1 and Q2. The bases of the transistors Q3 and Q4 are connected together. The collector of the transistor Q3 is connected to a diode D3. The collector of the transistor Q4 is connected to an opposite polarity diode D4. Opposite sides of the diodes D3 and D4 are connected to a resonant inductor L having its opposite side connected to ground.

A first switch control circuit 22 operatively associated with the first bidirectional switch 18 is connected to the node A and to the bases of the transistors Q3 and Q4. Thus, the first switch control circuit 22 controls the first bidirectional switch 18 responsive to a signal from the signal input source 10. The first switch control circuit 22 consists of a resistor R3 and capacitor C3 connected in series between the node A and the bases of the transistor Q4 and Q3. A resistor R4 is connected between the bases of the transistor Q4 and Q3 and the emitters of the transistors Q1, Q2, Q3 and Q4 and likewise the gate of the power switching device Q5.

A second switch control circuit 24 operatively associated with the second bidirectional switch 20 is connected to the node A and the second bidirectional switch 20 and is likewise controlled by a signal from the signal input source 10. The second switch control circuit 24 comprises a resistor R1 connected between the node A and the bases of the transistors Q1 and Q2 and a capacitor C1 connected between the bases of the transistors Q1 and Q2 and the emitters of the transistors Q1, Q2, Q3 and Q4, and likewise the gate of the power switching device Q5.

Principle of Operation (FIG. 3)

In this section, the operating principle of FIG. 3 is explained. When the signal at the input source 10 to the photo coupler 12 (Signal In) goes high, the upper transistor of the photo coupler turns ON.

A turn ON signal is applied to the R1-C1 combination that controls the switching state of transistors Q1 and Q2. R1-C1 is a typical delay circuit and after one time delay equal to τ.(=R1*C1) seconds, transistor Q2 turns ON and Q1 turns OFF.

The turn ON signal at node A also appears across the R3-C3-R4 combination of the first switch control circuit 22 in FIG. 3. In this case, since the element across the base and emitter of transistors Q3 and Q4 is a resistor R4, the R3-C3 combination acts as a differential circuit and converts the steady ON signal at the node A to a transitory pulse at the instant of application. In other words, transistor Q4 turns ON (and Q3 turns OFF) just for a brief period dictated by the values of R3 and C3, as soon as a positive voltage appears at node A due to the upper transistor of the photo coupler amplifier stage 16 being turned ON by the input signal (Signal In) going high in FIG. 3.

Turning ON of Q4 connects the resonating inductor L to the gate of the IGBT/MOSFET Q5 which was at −Vcc. Since the inductor L is at zero volts, which is more positive than −Vcc, current flows through the inductor L and the energy stored in the gate-emitter capacitance C is transferred to the inductor L in a resonant fashion, whereby the voltage across the gate-emitter junction swings from −Vcc to +Vcc, ideally. After this brief period of energy exchange, transistor Q4 turns OFF and the inductor L is electrically disconnected from the gate of the main IGBT/MOSFET Q5.

To see the mechanism from the resonating inductor point of view, it is important to follow the voltage across the inductor L. The voltage across the inductor L goes from zero to −Vcc instantly when it is connected to the gate-emitter of the main IGBT/MOSFET Q5 and then swings in a resonant fashion to +Vcc at the end of the resonant cycle since it is connected to the gate-emitter and follows the same voltage path. At the end of the resonant cycle, when it is disconnected from the gate-emitter junction, it immediately returns back to zero voltage since the average voltage across an inductor is zero and it returns to the zero voltage state.

Due to the parasitic resistance in the resonating inductor L and along the current flow path between the resonating inductor L and the gate of the main IGBT/MOSFET Q5, the voltage of the gate-emitter junction at the end of the resonant energy exchange period is not +Vcc but is a value that is lower than +Vcc and is denoted as $V_{res\text{-}final}$. The delayed turning ON of Q2 ensures that the difference between the voltage at the end of the resonant cycle ($V_{res\text{-}final}$) and the supply voltage Vcc, is ultimately eliminated by the charging current path into the Gate of IGBT/MOSFET Q5 via R2, D2, and Q2. Hence, the IGBT/MOSFET Q5 is charged from two paths—a quick resonant charging path provided by the energy exchange between resonating inductor L and gate-emitter capacitance C, and a voltage equalization period provided via the current flow path through the resistor R2.

When the main IGBT/MOSFET Q5 is needed to be turned OFF, the process is repeated in reverse. The main signal at the input (Signal In) goes low. This turns OFF the upper transistor of the photo coupler amplifier stage 16 and turns ON the lower MOSFET in the photo coupler amplifier stage 16. The node A is clamped to −Vcc when the lower MOSFET of the photo coupler turns ON. A negative going current pulse turns OFF Q2 and Q4 and turns ON Q1 and Q3.

The energy stored in the gate-emitter capacitance C of the main IGBT/MOSFET Q5 immediately transfers to the inductor L as the inductor voltage changes from +Vcc (ideally) to −Vcc (ideally) in a resonant manner. As explained earlier with regards to the turn ON process, a similar cycle ensues when the inductor L is connected to the gate-emitter junction of the main IGBT/MOSFET Q5 when transistor Q3 turns ON. The gate-emitter is at +Vcc and the inductor is at zero volts. The inductor L immediately goes to +Vcc and a resonant current starts to flow from the gate-emitter capacitance C to the 0V of source via the resonating inductor L. The gate-emitter voltage swings from +Vcc to −$V_{res\text{-}final}$ in a resonant manner. Similar to the turn ON process, a slower discharging path follows during the turn OFF process via diode D1 and resistor R2. Hence, the discharging of the gate-emitter capacitance C of the main IGBT/MOSFET Q5 also shows two stages—a quick resonant stage involving the resonating inductor L and a slower stage involving diode D1 and resistor R2.

At the end of the resonant period, transistor Q3 turns OFF and this disconnects the inductor L from the gate-emitter junction. The inductor voltage then returns to zero volt state and the condition of zero average voltage across inductor is thus met. After this brief resonant period, transistor Q1 remains ON and the gate-emitter junction is brought to −Vcc via D1 and R2.

Careful examination of the circuit in FIG. 3 reveals that the initial energy stored in the gate-emitter capacitance C is actually provided by the gate power supply. This energy is circulated in between the resonating inductor L and the gate-emitter capacitance C. The gate power supply subsequently provides only for the energy lost during transfer of energy between the resonating inductor L and the gate-emitter capacitor C of the main IGBT/MOSFET Q5.

As mentioned, with the gate drive circuit of FIG. 3, the energy required to turn ON and OFF the main IGBT/MOSFET Q5 is processed by the amplifier transistors of the photo coupler 12. In accordance with another embodiment of the invention, the main turn ON and turn OFF energies are not processed by the amplifier transistors of the photo coupler. This is instrumental in reducing the power loss in the photo coupler and also reduces the current rating of the photo coupler, which potentially results in a lower cost photo coupler. The alternative gate drive circuit is shown in FIG. 4.

Figure 4:
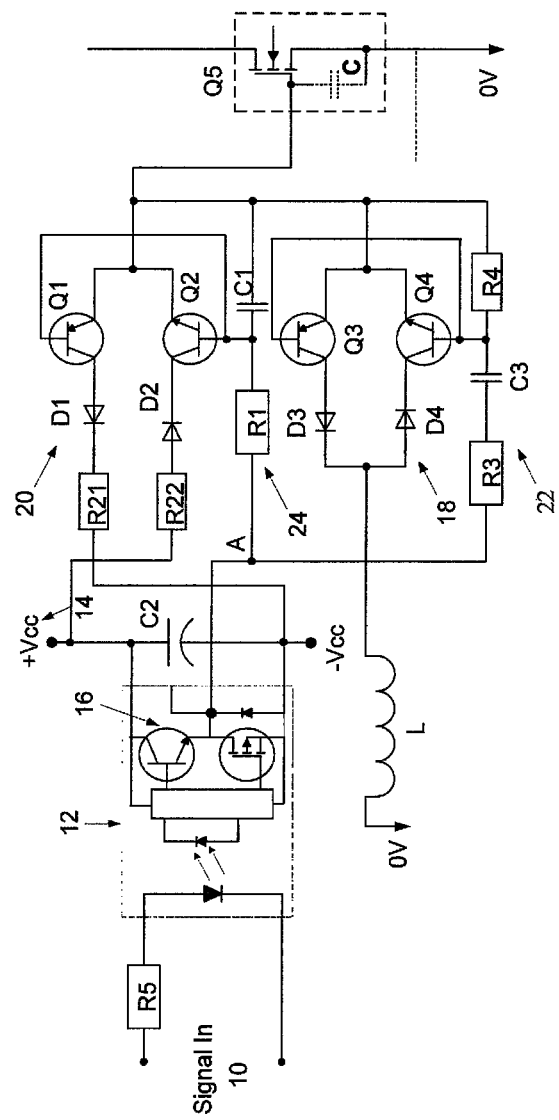
FIG. 4 is an electrical schematic of a resonant gate drive circuit according to a second embodiment of the invention.

In the alternative circuit of FIG. 4, the power path is provided directly from the power supply 14. Particularly, the second bidirectional switch comprises a resistor R21 between the diode D1 and the supply node −Vcc. A resistor R22 is between the diode D2 and the power supply node +Vcc. The first bidirectional switch 18 and the switch control circuits 22 and 24 are connected as in FIG. 3. As such, the photo coupler 12 is used only to process the control signal. This reduces the power burden on the photo coupler 12 significantly and also reduces the typical propagation delay present in photo couplers between the signal input and the signal output. Since the output signal from the photo coupler is used only to turn ON and OFF the signal transistors Q1~Q4, the delay in the photo coupler is significantly reduced. The current rating of the photo coupler is also reduced.

Principle of Operation (FIG. 4)

In this section, the operating principle of FIG. 4 is explained. When the signal at the input signal source 10 to the photo coupler 12 (Signal In) goes high, the upper transistor of the photo coupler 12 turns ON.

A turn ON signal is applied to the R1-C1 combination that controls the switching state of transistors Q1 and Q2. R1-C1 is a typical delay circuit and after one time delay equal to τ.(=R1*C1) seconds, transistor Q2 turns ON and Q1 turns OFF.

The turn ON signal at node A also appears across the R3-C3-R4 combination of the second switch control circuit 22 in FIG. 4. In this case, since the element across the base and emitter of transistors Q3 and Q4 is a resistor R4, the R3-C3 combination acts as a differential circuit and converts the steady ON signal at point A to a transitory pulse at the instant of application. In other words, transistor Q4 turns ON (and Q3 turns OFF) just for a brief period dictated by the values of R3 and C3, as soon as a positive voltage appears at node A due to the upper transistor of photo coupler being turned ON by the input signal (Signal In) going high in FIG. 4.

Turning ON of Q4 allows connecting the resonating inductor L to the gate of the IGBT/MOSFET Q5 which was at −Vcc. Since the inductor is at zero volts, which is more positive than −Vcc, current flows through the inductor L and the energy stored in the gate-emitter capacitor C is transferred to the inductor L in a resonant fashion, whereby the voltage across the gate-emitter junction swings from −Vcc to +Vcc, ideally. After this brief period of energy exchange, transistor Q4 turns OFF and the inductor L gets electrically disconnected from the gate of the main IGBT/MOSFET Q5.

As explained earlier, at the end of the resonant cycle, when the inductor L is disconnected from the gate-emitter junction, it immediately returns back to zero voltage since the average voltage across an inductor is zero and it returns to the zero voltage state.

Due to the parasitic resistance in the resonating inductor L and along the current flow path between the resonating inductor and the gate of the main IGBT/MOSFET Q5, the voltage of the gate-emitter junction at the end of the resonant energy exchange period is not +Vcc but is a value that is lower than +Vcc and is denoted as $V_{res-final}$. The delayed turning ON of Q2 ensures that the difference between the voltage at the end of the resonant cycle ($V_{res-final}$) and the supply voltage Vcc, is ultimately eliminated by the charging current path into the Gate of IGBT/MOSFET Q5 via R22, D2, and Q2. The main difference in FIG. 4 from FIG. 3 is that the second charging path does NOT involve the photo-coupler 12. Current flows directly from the +Vcc source into the gate-emitter junction via R22, D2 and Q2, thereby reducing the current requirement of the photo-coupler 12. The power loss in the photo-coupler 12 is also significantly reduced and it makes it possible to choose a photo-coupler of faster switching time. The lower current rating of the photo-coupler reduces the size and cost of the photo-coupler as well.

When the main IGBT/MOSFET Q5 is needed to be turned OFF, the process is repeated in reverse. The main signal at the input (Signal In) goes low. This turns OFF the upper transistor and turns ON the lower MOSFET in the photo coupler 12. The node A is clamped to −Vcc when the lower MOSFET of the photo coupler turns ON. A negative going current pulse turns OFF Q2 and Q4 and turns ON Q1 and Q3.

The energy stored in the gate-emitter capacitance C of the main IGBT/MOSFET Q5 immediately transfers to the inductor L as the inductor voltage changes from +Vcc (ideally) to −Vcc (ideally) in a resonant manner. As explained earlier with regards to the turn ON process, a similar cycle ensues when the inductor L is connected to the gate-emitter junction of the main IGBT/MOSFET Q5 when transistor Q3 turns ON. The gate-emitter is at +Vcc and the inductor is at zero volts. The inductor L immediately goes to +Vcc and a resonant current starts to flow from the gate-emitter capacitance C to the 0V of source via the resonating inductor L. The gate-emitter voltage swings from +Vcc to $-V_{res-final}$ in a resonant manner. Similar to the turn ON process, a slower discharging path follows during the turn OFF process via diode D1 and resistor R21. Here again, the discharge path does NOT involve the photo-coupler 12. Discharge current flows directly into −Vcc via Q1, D1 and R21. The benefits of lower current rating, smaller size, lower cost, and faster photo-coupler 12 holds true for the discharge path as well.

Similar to the circuit shown in FIG. 3, resistors R21 and R22 in FIG. 4 function to bring the gate voltage to the desired level of +Vcc and −Vcc. The loss in the resonating inductor does not allow full charging or discharging of the gate-emitter capacitance and so assist resistors R21 and R22 are used to complete the process. Since charging and discharging paths are different in the proposed structure, two independent resistors are needed to complete the gate charging/discharging process. Each of the resistors R21 and R22 carry current only during the ON or the OFF process and so the power rating of resistors R21 and R22 are half of its equivalent in the circuit shown in FIG. 3.

The two circuits proposed here in FIGS. 3 and 4 have been compared for performance. The circuits were implemented using standard commercially available signal transistors. Instead of using standard signal diodes, Schottky diodes (D1-D4) are used. An R-C delay circuit is used to delay the turn ON and turn OFF of the main gating signal to the IGBT/MOSFET Q5. During this delay time, the auxiliary circuit is made to operate to allow the energy stored in an inductor from the previous cycle to charge or discharge the gate-emitter capacitance C, allowing for a fast transition of the gate-emitter voltage of the IGBT/MOSFET Q5. Results of implementing this scheme show that the propagation delay reduced from 550 ns to 480 ns.

The essential point of power saving is to effectively use the existing energy stored in the gate-emitter capacitance C by means of resonance. Only the loss component during resonance needs to be supplied from the power source. In other words, the energy stored in the gate-emitter capacitance C at the end of resonance is ($\frac{1}{2}$) $C_{G-E}$ ($V_{res\ final}^2$). In order to charge the capacitance voltage to +Vcc, additional energy of ($\frac{1}{2}$) $C_{G-E}$ ($V_{cc}^2 - V_{res\ final}^2$) is needed. If this energy is to be supplemented from the power source 12 through a resistor, the same amount of energy will need to be expended in the resistor. Hence, the total energy supplied from the power supply can be estimated to be $C_{G-E}$ ($V_{cc}^2 - V_{res\ final}^2$). The energy dissipated in the resistor (R21 or R22 in FIG. 4) is independent of the value of resistance in the circuit and depends on the supply voltage Vcc and $V_{res\ final}$. However, $V_{res\ final}$ depends on the voltage drops along the resonant current path. It includes the parasitic resistance of the current trace, the voltage drop across the diode and transistor and the parasitic resistance of the resonating inductor.

In addition, by allowing the loss component to flow directly into the gate-emitter circuit without flowing through the photo coupler, the delay involved in transmitting the energy is reduced, allowing for higher frequency operation. The current rating of the photo coupler is also reduced, resulting in a potential savings in cost.

Test results show that the power consumption using the proposed circuit reduces by a factor of greater than 5, the ON delay improves from 1.3 μsec to 490 ns, and the OFF delay improves from 600 ns to 400 ns, when compared to a traditional gate drive circuit.

The proposed technique enables a gate drive circuit to operate the high performance SiC/GaN switching devices at a high frequency without significant increase in the gate drive power. It realizes added value to the drive system such as high-speed motor drive, high response control and total converter size/cost reduction when effective PWM filters are combined.

The invention claimed is:

1. A resonant gate drive circuit for a power switching device for a high frequency power converter, comprising:
   a signal input source;
   a power supply;

a resonant inductor;
an electrical isolator connected between the signal input source and a switching node, the electrical isolator being connected to the power supply;
a first bidirectional switch connected between the resonant inductor and the power switching device and including a first switch control circuit connected to the switching node to be controlled by a signal from the signal input source; and
a second bidirectional switch connected between the power supply and the power switching device and including a second switch control circuit connected to the switching node to be controlled by the signal from the signal input source,
wherein the first and second control circuits are adapted to control the first bidirectional switch to provide a first charge path during a resonant period from the resonant inductor to gate-emitter capacitance of the power switching device defining a quick resonant charge path and to control the second bidirectional switch to provide a second charge path defining a voltage equalization charge path subsequent to the resonant period.

2. The resonant gate drive circuit of claim 1 wherein the second bidirectional switch is connected between the switching node and the power switching device wherein the signal is amplified by transistors in the electrical isolator.

3. The resonant gate drive circuit of claim 1 wherein the second bidirectional switch is connected directly to the power supply.

4. The resonant gate drive circuit of claim 1 wherein the first control circuit comprises a differential circuit that converts a signal change at the switching node to a transitory pulse.

5. The resonant gate drive circuit of claim 1 wherein the second control circuit comprises a delay circuit.

6. The resonant gate drive circuit of claim 1 wherein a resistor is connected between the power supply and the second bidirectional switch wherein the voltage equalization charge path comprises a slower discharging stage of the input gate-emitter capacitance.

7. The resonant gate drive circuit of claim 1 wherein initial energy stored in the gate-emitter capacitance is provided from the power supply and thereafter, the power supply subsequently provides energy lost during transfer of energy between the resonant inductor and the gate-emitter capacitance during the resonant period.

8. The resonant gate drive circuit of claim 1 wherein the electrical isolator comprises a photo coupler.

9. The resonant gate drive circuit of claim 1 wherein the second bidirectional switch includes first and second transistors each connected in series with a diode and a resistor and to opposite polarities of the power supply.

10. The resonant gate drive circuit of claim 1 wherein voltage across the resonant inductor goes from zero to −Vcc instantly when it is initially connected by the first bidirectional switch to the gate-emitter capacitance and then swings in a resonant fashion to +Vcc at the end of the resonant period since the resonant inductor is connected to the gate-emitter capacitance and follows the same voltage path and wherein at the end of the resonant cycle, when the resonant inductor is disconnected from the gate-emitter capacitance, resonant inductor voltage returns back to zero voltage.

11. A resonant gate drive circuit for a power switching device, having a gate-emitter capacitance, for a high frequency power converter, comprising:
a signal input source;
a power supply;
a resonant inductor;
an electrical isolator connected between the signal input source and a switching node, the electrical isolator being connected to the power supply;
a first bidirectional switch connected between the resonant inductor and the power switching device and including a first switch control circuit connected to the switching node to be controlled by a signal from the signal input source; and
a second bidirectional switch connected between the power supply and the power switching device and including a second switch control circuit connected to the switching node to be controlled by the signal from the signal input source,
wherein the first and second control circuits are adapted to control the first bidirectional switch to provide a first charge path during a resonant period from the resonant inductor to the gate-emitter capacitance and to control the second bidirectional switch to provide a second charge path defining a voltage equalization charge path subsequent to the resonant period wherein initial energy stored in the gate-emitter capacitance is provided from the power supply and thereafter, the power supply subsequently provides energy lost during transfer of energy between the resonant inductor and the gate-emitter capacitance during the resonant period.

12. The resonant gate drive circuit of claim 11 wherein the second bidirectional switch is connected between the switching node and the power switching device wherein the signal is amplified by transistors in the electrical isolator.

13. The resonant gate drive circuit of claim 11 wherein the second bidirectional switch is connected directly to the power supply.

14. The resonant gate drive circuit of claim 11 wherein the first control circuit comprises a differential circuit that converts a signal change at the switching node to a transitory pulse.

15. The resonant gate drive circuit of claim 11 wherein the second control circuit comprises a delay circuit.

16. The resonant gate drive circuit of claim 11 wherein a resistor is connected between the power supply and the second bidirectional switch wherein the voltage equalization charge path comprises a slower discharging stage of the gate-emitter capacitance.

17. The resonant gate drive circuit of claim 11 wherein the first and second control circuits are adapted to control the first bidirectional switch to provide the first charge path during the resonant period from the resonant inductor to the gate-emitter capacitance defining a quick resonant charge path and to control the second bidirectional switch to provide the second charge path defining a voltage equalization charge path subsequent to the resonant period.

18. The resonant gate drive circuit of claim 11 wherein the electrical isolator comprises a photo coupler.

19. The resonant gate drive circuit of claim 11 wherein the second bidirectional switch includes first and second transistors each connected in series with a diode and a resistor and to opposite polarities of the power supply.

20. The resonant gate drive circuit of claim 11 wherein voltage across the resonant inductor goes from zero to −Vcc instantly when it is initially connected by the first bidirectional switch to the gate-emitter capacitance and then swings in a resonant fashion to +Vcc at the end of the resonant period since the resonant inductor is connected to the gate-emitter capacitance and follows the same voltage path and wherein at the end of the resonant cycle, when the resonant inductor is disconnected from the gate-emitter capacitance, resonant inductor voltage returns back to zero voltage.

* * * * *

UNITED STATES PATENT AND TRADEMARK OFFICE
CERTIFICATE OF CORRECTION

PATENT NO. : 8,547,143 B2
APPLICATION NO. : 13/211481
DATED : October 1, 2013
INVENTOR(S) : Mahesh M. Swamy and Tsuneo Joe Kume It is certified that error appears in the above-identified patent and that said Letters Patent is hereby corrected as shown below:

Title Page:

Item 75 there is a typographical error in the City for the inventor Tsuneo Joe Kume.

Katikyushu (JP) should be Kitakyushu (JP)

Signed and Sealed this
Twenty-fourth Day of December, 2013

Margaret A. Focarino
*Commissioner for Patents of the United States Patent and Trademark Office*